US012813267B2

(12) United States Patent
Williamson et al.

(10) Patent No.: US 12,813,267 B2
(45) Date of Patent: Nov. 24, 2026

(54) ELECTRONIC DEVICE WITH THERMALLY CONDUCTIVE MATERIAL IN SEMICONDUCTOR DIE TRENCH

(71) Applicant: Texas Instruments Incorporated, Dallas, TX (US)

(72) Inventors: Jaimal Williamson, McKinney, TX (US); Hiep Nguyen, Cedar Hill, TX (US); Patrick Thompson, Allen, TX (US); Qiao Chen, Flower Mound, TX (US); Usman Chaudhry, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 359 days.

(21) Appl. No.: 18/428,987

(22) Filed: Jan. 31, 2024

(65) Prior Publication Data

US 2025/0246506 A1 Jul. 31, 2025

(51) Int. Cl.

| | |
|---|---|
| ***H10W 40/25*** | (2026.01) |
| ***H10P 50/00*** | (2026.01) |
| ***H10W 40/22*** | (2026.01) |
| ***H10W 70/685*** | (2026.01) |
| ***H10W 90/00*** | (2026.01) |
| *H10W 74/00* | (2026.01) |

(52) U.S. Cl.

CPC ........... *H10W 40/259* (2026.01); *H10P 50/00* (2026.01); *H10W 40/22* (2026.01); *H10W 40/258* (2026.01); *H10W 70/685* (2026.01); *H10W 90/701* (2026.01); *H10W 74/00* (2026.01); *H10W 90/724* (2026.01)

(58) Field of Classification Search

CPC . H10W 40/259; H10W 40/22; H10W 40/258; H10W 70/685; H10W 90/701; H10W 74/00; H10W 90/724; H10P 50/00

See application file for complete search history.

(56) References Cited

U.S. PATENT DOCUMENTS

| | | | |
|---|---|---|---|
| 8,298,944 | B1 | 10/2012 | West |
| 8,378,701 | B2 | 2/2013 | West et al. |

*Primary Examiner* — Samuel A Gebremariam

(74) *Attorney, Agent, or Firm* — Ronald O. Neerings; Frank D. Cimino

(57) ABSTRACT

An electronic device includes a semiconductor die and a package structure, the semiconductor die having a semiconductor material with a first thermal conductivity, opposite first and second sides, a terminal on the first side, a trench extending into the second side, and a thermally conductive material in the trench, the thermally conductive material having a second thermal conductivity that is greater than the first thermal conductivity, the first side of the semiconductor die facing a lead frame or substrate, the package structure enclosing a portion of the semiconductor die and a portion of the lead frame or substrate, and the package structure exposing a portion of the thermally conductive material along the second side of the semiconductor die.

12 Claims, 10 Drawing Sheets

ELECTRONIC DEVICE WITH THERMALLY CONDUCTIVE MATERIAL IN SEMICONDUCTOR DIE TRENCH

BACKGROUND

Thermal performance of electronic devices is important to increase device power density and/or reduced device and system size. For example, improving heat removal or thermal dissipation of flip chip, chip-scale package (FCCSP) devices and other packages is a design goal for modern electronic device applications. Over molded encapsulation of a semiconductor die with standard epoxy molding compound (EMC) is generally insufficient from a thermal conductivity standpoint to meet this challenge, and thermal performance improvement through substituting higher thermal conductivity EMC materials is limited. Thicker semiconductor dies can be used for improved lateral heat spreading, but this involves a tradeoff with increased resistance due to longer path vs increased interface area with thicker Si and increases the final device size which may be unacceptable for certain applications. Thermal performance may benefit from increased copper or other metal density in the substrate, but this may also increase device size as well as cost and complexity of the manufacturing process. Flip chip packages can be designed to include a copper or other metal lid to operate as a heat spreader to distribute heat, but this adds cost and complexity to the assembly process and may reduce process throughput.

SUMMARY

In one aspect, an electronic device includes a semiconductor die having a semiconductor material with a first thermal conductivity, opposite first and second sides, a terminal on the first side, a trench extending into the second side, and a thermally conductive material in the trench. The thermally conductive material has a second thermal conductivity that is greater than the first thermal conductivity and the first side of the semiconductor die faces a lead frame or substrate. The electronic device has a package structure that encloses a portion of the semiconductor die and a portion of the lead frame or substrate, and the package structure exposes a portion of the thermally conductive material along the second side of the semiconductor die.

In another aspect, a system includes a circuit board and an electronic device that comprises a semiconductor die, a lead frame or substrate soldered to the circuit board, and a package structure. The semiconductor die has a semiconductor material with a first thermal conductivity, opposite first and second sides, a terminal on the first side, a trench extending into the second side, and a thermally conductive material in the trench. The thermally conductive material has a second thermal conductivity that is greater than the first thermal conductivity and the first side of the semiconductor die faces a lead frame or substrate. The electronic device has a package structure that encloses a portion of the semiconductor die and a portion of the lead frame or substrate, and the package structure exposes a portion of the thermally conductive material along the second side of the semiconductor die.

In a further aspect, a method of fabricating an electronic device includes forming a trench that extends into a semiconductor wafer, forming a thermally conductive material in the trench, the thermally conductive material having a thermal conductivity greater than that of the semiconductor wafer, separating a semiconductor die from the semiconductor wafer, the semiconductor die including the trench and the thermally conductive material in the trench, and packaging the semiconductor die in a package structure that exposes a portion of the thermally conductive material along a side of the semiconductor die.

DETAILED DESCRIPTION

Figure 1:
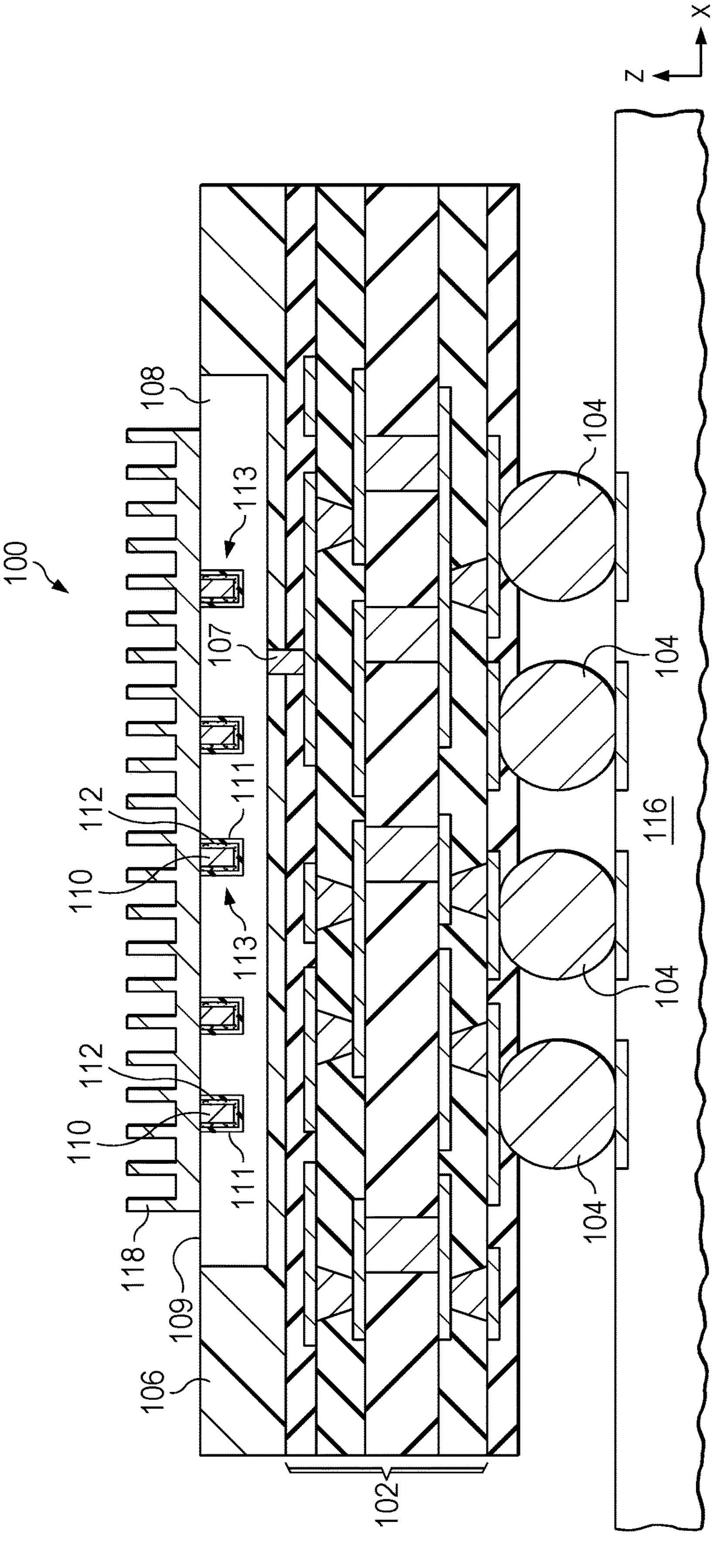
FIG. 1 is a partial sectional side elevation view taken along line 1-1 of FIG. 1A, showing a system including an electronic device installed on a circuit board, with thermally conductive material filling trenches on an exposed top side of a semiconductor die with a heatsink installed on the top side.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material.

Unless otherwise stated, "about," "approximately," or "substantially" preceding a value means+/−10 percent of the stated value. One or more structures, features, aspects, components, etc., may be referred to herein as first, second, third, etc., such as first and second terminals, first, second, and third, wells, etc., for ease of description in connection with a particular drawing, where such are not to be construed as limiting with respect to the claims. Various disclosed structures and methods of the present disclosure may be beneficially applied to manufacturing an electronic device such as an integrated circuit. While such examples may be expected to provide various improvements, no particular result is a requirement of the present disclosure unless explicitly recited in a particular claim.

Figure 1A:
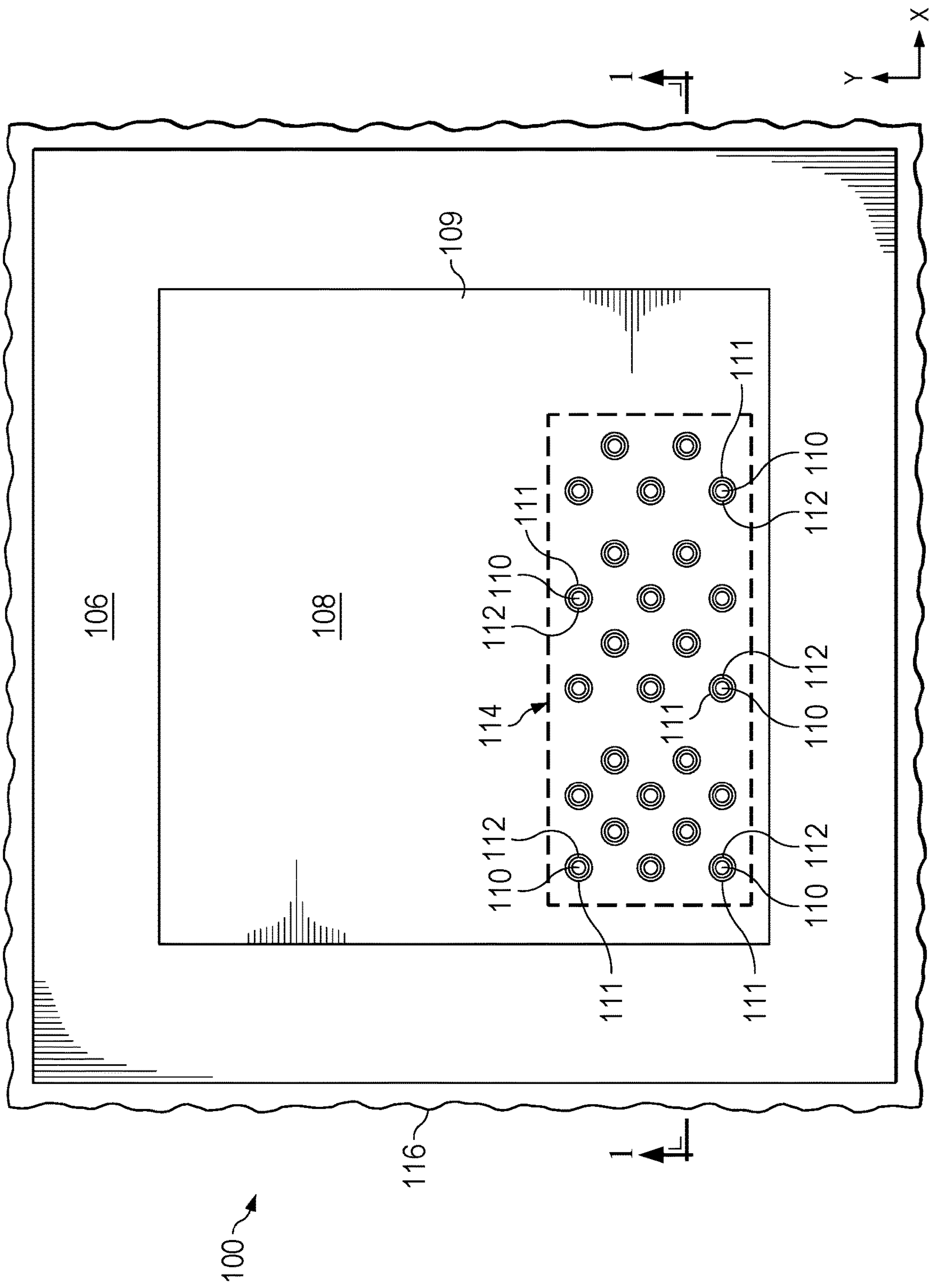
FIG. 1A is a partial top plan view of the system an electronic device of FIG. 1.

Referring initially to FIGS. 1 and 1A, FIG. 1 shows a sectional side view of a system including an electronic device 100 installed on a circuit board 116 taken along line 1-1*a* of FIG. 1A, and FIG. 1A shows a top view of the system an electronic device 100. The electronic device 100 includes deep silicon trenches (DSTs), hereinafter referred to as trenches 113 filled with thermally conductive material 110 on a top side 109 of a semiconductor die 108 exposed outside a molded package structure 106 to improve the bulk thermal conductivity. The example system in FIG. 1 includes an optional heatsink 118 installed on the top side of the semiconductor die 108 to further enhance heat removal from the semiconductor die 108 in operation of the electronic device 100. In another implementation, the heatsink 118 can be omitted. The illustrated example is a flip chip ball grid array chip scale package (FCCSP or FCBGA) with conductive metal terminals 107 (e.g., copper pillars) of the semiconductor die 108 soldered to corresponding conductive pads on a top level of a multilevel package substrate 102. Conductive solder balls 104 form electrical leads or terminals that are soldered to corresponding conductive metal pads on a top side of the host circuit board 116.

Different types and forms of package arrangements can be used in different implementations, for example, quad flat no lead (QFN), dual flat no lead (DFN) and other types of packages that can include conductive metal leads of a starting single or multilevel package substrate and/or a starting lead frame (not shown). In the illustrated example, the solder balls 104 of the multilevel package substrate 102 are soldered to the circuit board 116. In other implementations, different types of conductive metal leads of a starting lead frame or single or multilevel package substrate are configured to be soldered to a host circuit board.

The example electronic device 100 in FIG. 1 also includes an insulation layer 111 disposed between the thermally conductive material 110 and the semiconductor material, for example, silicon dioxide or other suitable electrical insulator, preferably having a thermal conductivity that is at least as high as that of the underlying semiconductor material of the semiconductor die 108. In another example, the insulation layer 111 is omitted. The insulation layer 111 can help mitigate electrical interaction between circuitry and/or components formed on or in the semiconductor die 108 and other circuits or components, particularly for electrically conductive thermally conductive material 110 (e.g., copper, solder, etc.) and any attached electrically conductive heatsink 118.

The illustrated example in FIG. 1 also includes an adhesion layer 112 disposed between the insulation layer 111 and the thermally conductive material 110 to promote adhesion of the thermally conductive material within the trenches 113. In another implementation, the insulation layer 111 is provided and the adhesion layer 112 can be omitted. In a further example, an adhesion layer 112 can be included and the insulation layer 111 can be omitted. In a further implementation, the thermally conductive material 110 is formed directly in the trenches 113 (e.g., and optionally along the top side 109 of the semiconductor die 108) and directly contacts the semiconductor material of the semiconductor die 108.

The semiconductor die 108 has a semiconductor material (e.g., that is or includes silicon (Si), gallium nitride (GaN), etc.) with a first thermal conductivity. The semiconductor die 108 includes a lower or bottom first side that faces the lead frame or substrate 102 and an opposite second or top side 109, and one or more terminals 107 on the first side (one of which is shown in the sectional view of FIG. 1) that are soldered or otherwise attached to form an electrical connection between an internal circuit or component of the semiconductor die 108 and the multilevel package substrate 102.

The semiconductor die 108 includes one or more of the trenches 113, which can also be referred to as channels. The individual trenches 113 extend into the second side 109 of the semiconductor die 108. The thermally conductive material 110 is disposed at least partially in the respective trenches 113. The thermally conductive material 110 has a second thermal conductivity that is greater than the first thermal conductivity and helps to promote improved thermal performance of the semiconductor die 108 in operation of the electronic device 100, for example, by facilitating heat transfer upward from the semiconductor die 108 to the ambient and/or two any installed heatsink 118.

The package structure 106 encloses a portion of the semiconductor die 108, for example, the lateral sides and bottom or first side of the semiconductor die 108 as shown in FIG. 1. In addition, the package structure 106 encloses a portion of the lead frame or substrate 102, for example, the top side of the multilevel package substrate 102 can be covered with epoxy molding material of the package structure 106. The package structure 106 exposes a portion of the thermally conductive material 110 along the second side 109 of the semiconductor die 108. In the illustrated example, the top side of the molded package structure 106 is substantially coplanar with the top second side 109 of the semiconductor die 108. In other implementations, the top side of the package structure 106 and the top side 109 of the semiconductor die 108 need not be coplanar.

Any suitable thermally conductive material 110 can be used which has a thermal conductivity that is greater than that of the semiconductor material of the semiconductor die 108, independent of electrical conduction properties thereof. Any suitable conductive material formation process and equipment can be used to form the thermally conductive material 110 in the trench or trenches 113 of the semiconductor die 108.

In one example, the thermally conductive material 110 is or includes metal. In one example, the metal thermally conductive material 110 is or includes copper. In another implementation, the metal thermally conductive material 110 in the trenches 113 is or includes aluminum. In another example, the thermally conductive material 110 is or includes graphene. In a further example, the thermally conductive material 110 is or includes solder. In one implementation, the thermally conductive solder material 110 is or includes one or more of copper (Cu), tin (Sn) and silver (Ag) (e.g., sometimes referred to as "SAC" solder), such as SAC305/396 solder with a nonzero copper composition along with tin and silver, which can be formed by any suitable deposition or layer formation process, silk screening, ball drop process is, etc. In another example, the thermally conductive solder material 110 can have little or no copper in the solder, such as plated solder. In yet another example, the thermally conductive material 110 is or includes boron nitride.

As further shown in FIG. 1A, the trenches 113 in one example can form a pattern, such as an area array of columns and rows or other groupings and extend to the top or second side 109 of the semiconductor die 108 or a single isolated trench (not shown) can be formed at an identified or suspected hot spot or region 114. In another example, the semiconductor die 108 has multiple trenches that extend into the second side and form a pattern along the entire second side 109. In another example, a single trench 113 can form a pattern in an identified hot spot or can extend in a pattern along the entire second side 109, for example, a spiral design (not shown) or two or more trenches 113 can form an integrated pattern, such as interleaved comb shapes, concentric circles, rectangles, etc. in a predetermined (e.g., hot shot) portion of the second side 109 or along the entire second side 109. Although illustrated as substantially circular, the trenches 113 and the thermally conductive material 110 formed therein can be of any suitable profile, such as rectangular, circular, oval, longitudinally extending rectangles or ovals, or other suitable profile to facilitate heat extraction from the semiconductor die 108 and/or any particular hotspot or region 114 thereof. The isolated trench pattern example in FIG. 1A is designed to conform to the geometry of the identified or suspected hot spot 114 associated with the particular circuitry and layout of the semiconductor die 108 to facilitate improved heat dissipation from the semiconductor die 108 to an optional heat sink 118 or to the ambient in a system installation.

Figure 1B:
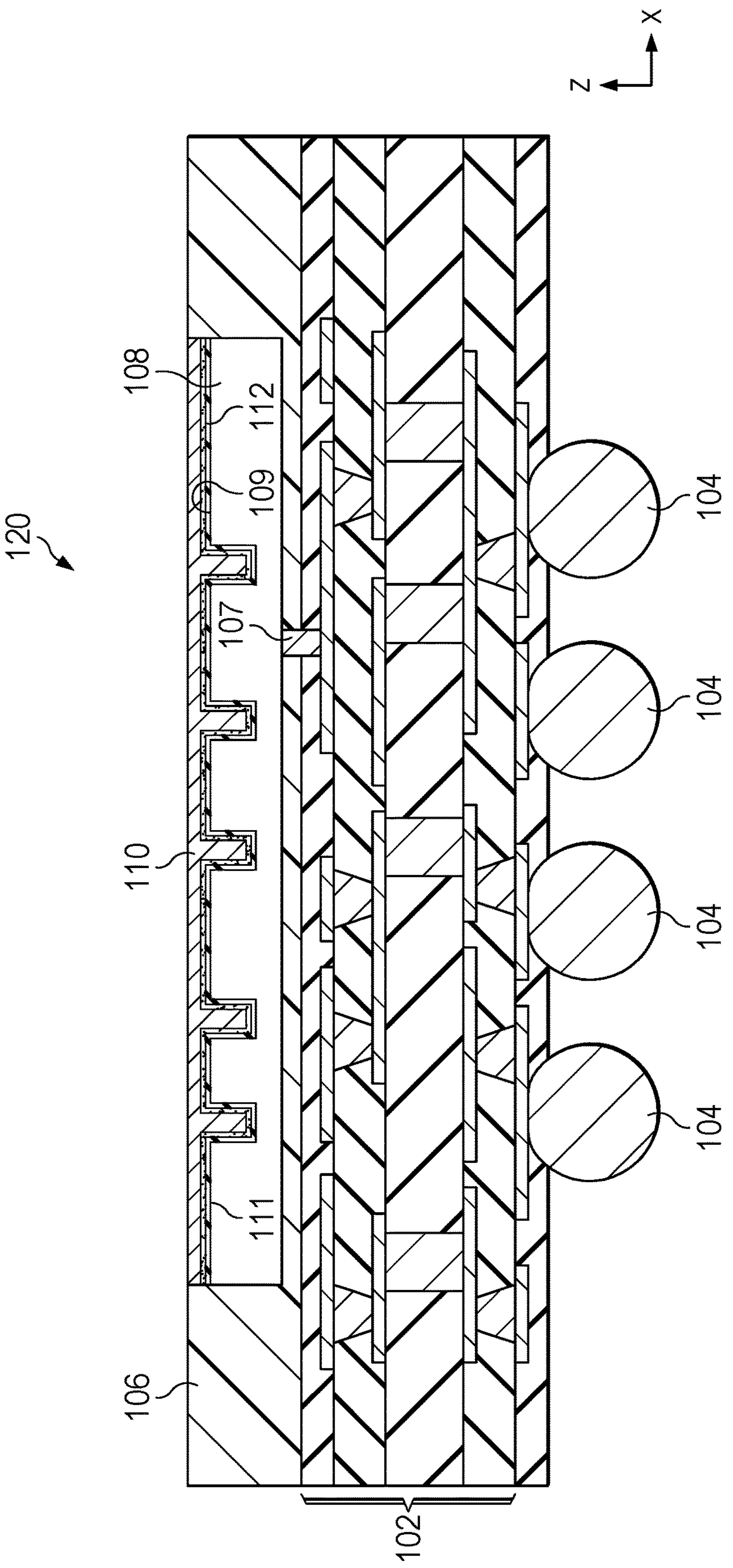
FIG. 1B is a partial sectional side elevation view of another example electronic device with the thermally conductive material and the semiconductor material extending outside the die trenches along the top side of the semiconductor die.

FIG. 1B shows another example electronic device 120 having similarly numbered structures, materials, and features as described above in connection with the electronic device 100 of FIGS. 1 and 1A except as described hereinafter. The electronic device 120 in FIG. 1B includes the thermally conductive material 110 extending in and substantially filling the trenches 113 along the top or second side 109 of the semiconductor die 108, alone or in any combination with one or both of the insulation layer 111 and/or the adhesion layer 112 as previously described. In this example, however, the thermally conductive material 110 (and any included insulation layer 111 and/or adhesion layer 112) extends further outside the trenches 113 and covers at least a portion of the top side 109 of the semiconductor die 108.

In another example that includes one or both of the insulation layer 111 and/or the adhesion layer 112, the second side 109 of the semiconductor die 108 (during wafer processing of a wafer having multiple prospective die areas) can be planarized after formation of one or both of the layers 111 and/or 112 and prior to filling the trenches 113 with the thermally conductive material 110, such that subsequent formation of the thermally conductive material 110 provides a structure which the layer or layers 111 and/or 112 extend along the sidewalls and bottom of the trenches 113 but do not extend outside the trenches and over the top side 109 of the semiconductor die 108, whereas the thermally conductive material 110 can extend along all or a portion of the top side 109 of the semiconductor die 108.

The semiconductor die trenches 113 and the thermally conductive material 110 therein facilitates lowering the electronic device junction temperature theta $j_c$ beyond the thermal conductivity obtained by simply exposing the semiconductor die material outside a package structure. Thermal simulations indicate that designs having an exposed die and a lidded package can provide a low thermal resistance path to an installed heat sink, for example, approximately 21% higher theta je four and exposed die solution compared to a lidded package. The electronic devices 100 and 120 provide solutions to help reduce the theta je gap between exposed die and lidded solution, for example, to facilitate an exposed die solution to have a theta $j_c$ between 1.9° C./W and 1.5° C./W due increase bulk thermal conductivity in certain implementations.

In one comparative example, for a baseline silicon equivalent thermal conductivity prediction with a normal thermal conductivity of 120 W/mK, an example implementation of the electronic device 100 with thermally conductive copper material 110 in silicon semiconductor die trenches 113 provides a theta $j_c$ of 171.6394 approximately 40% increase in thermal performance. Another simulated example using graphing thermally conductive material 110 provides approximately 400% improvement with a thermal conductivity of 466.72 W/mK.

Figure 10:
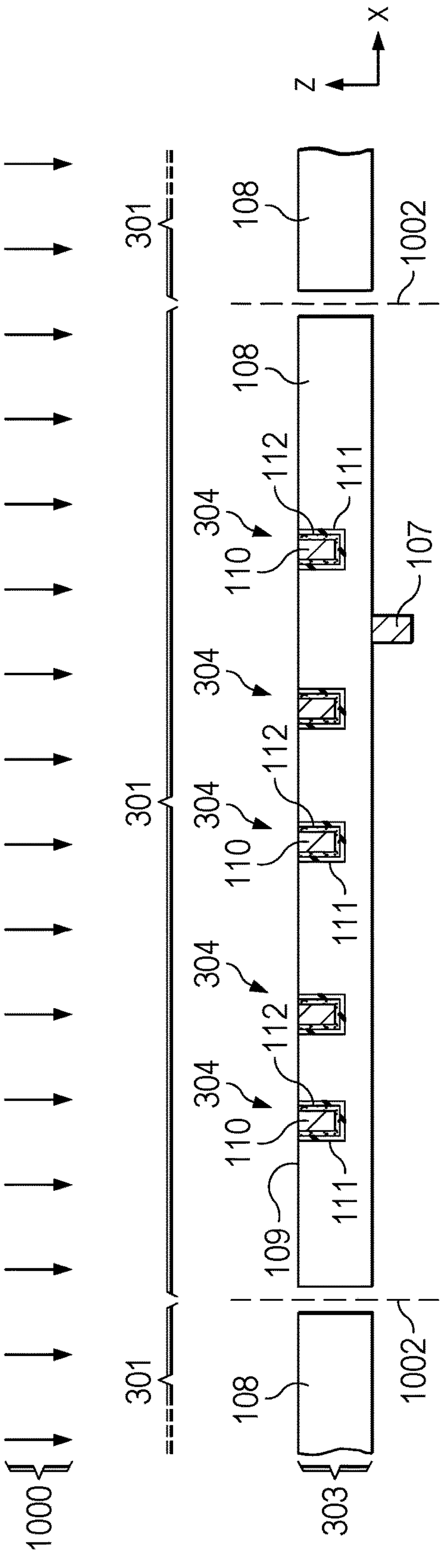
Figure 11:
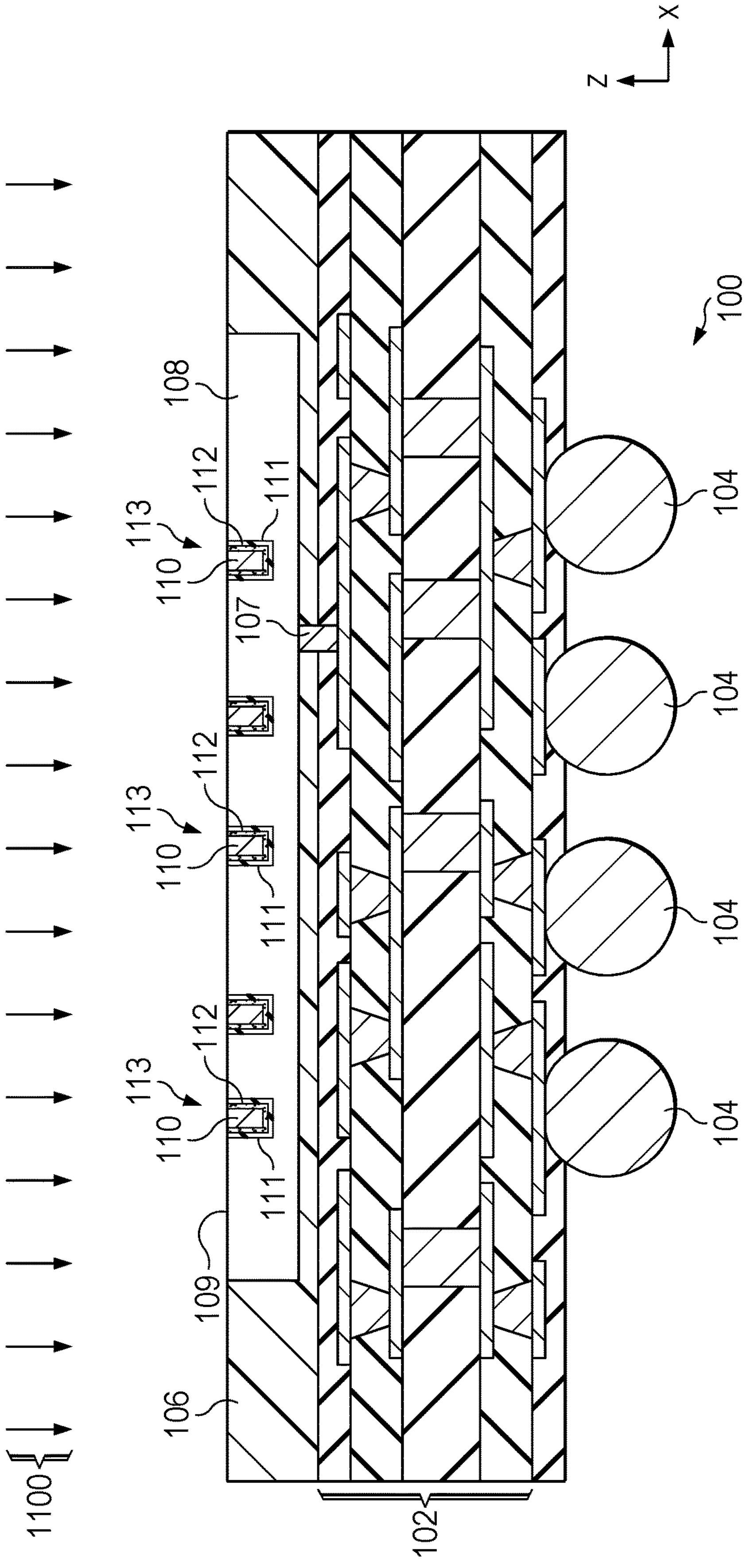
Figure 12:
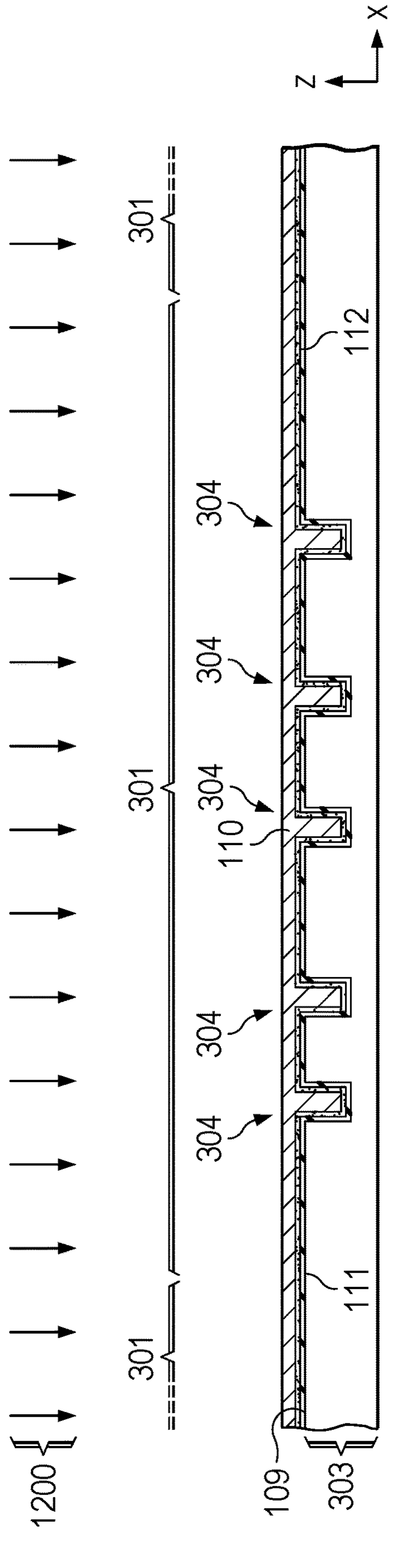
FIGS. 12 and 13 are partial sectional side elevation views of the example electronic device of FIG. 1B undergoing fabrication processing according to the method of FIG. 2.
Figure 13:
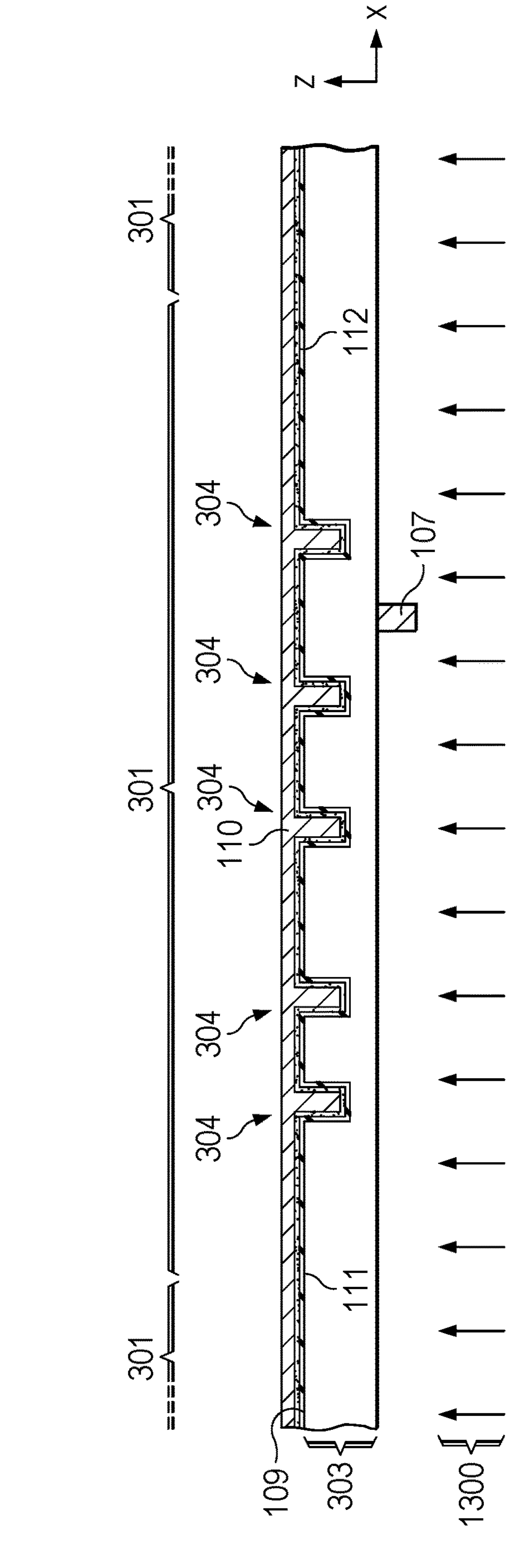

Referring also to FIGS. 2-13, FIG. 2 shows a method 200 of fabricating an electronic device, FIGS. 3-11 illustrate an implementation of the electronic device 100 of FIGS. 1 and 1A undergoing fabrication processing according to the method 200, and FIGS. 12 and 13 show an implementation of the example electronic device 120 of FIG. 1B undergoing fabrication processing according to an alternative implementation of the method 200.

Figure 2:
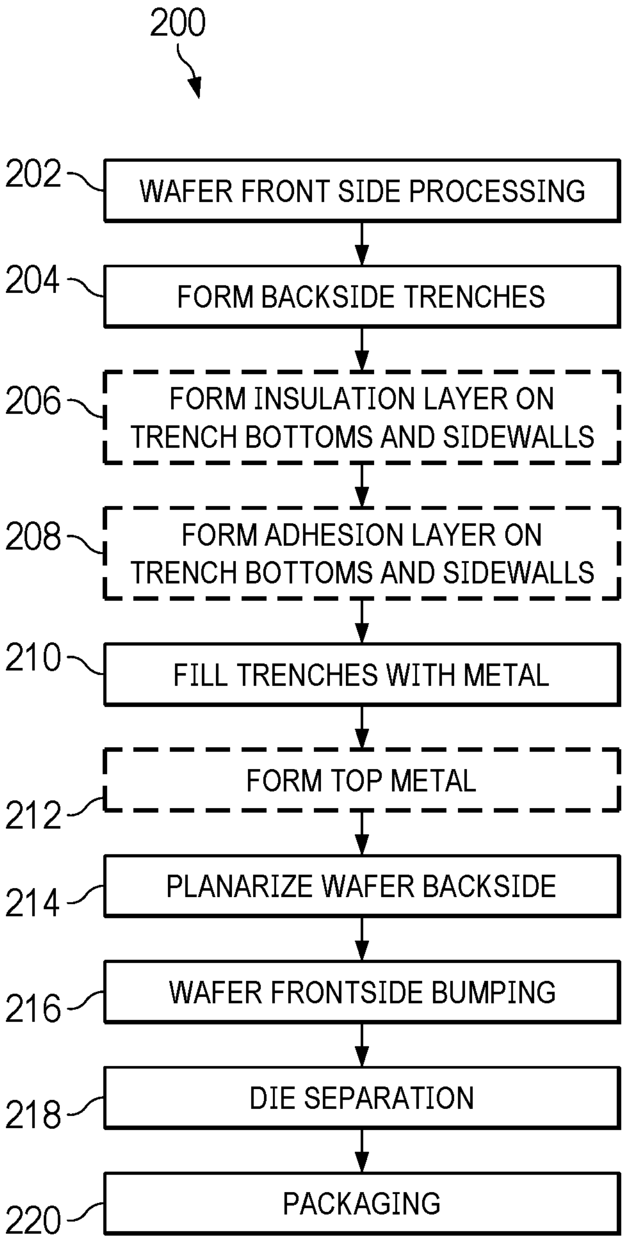
FIG. 2 is a flow diagram of a method of fabricating an electronic device.

The method 200 begins at 202 in FIG. 2 with front side processing of a starting semiconductor wafer, for example, to form transistors, resistors, and/or other electronic components and circuits on and/or in a side of a silicon or other semiconductor wafer. The wafer level processing can include concurrent formation of front side processing of multiple prospective die areas of a starting wafer.

Figure 3:
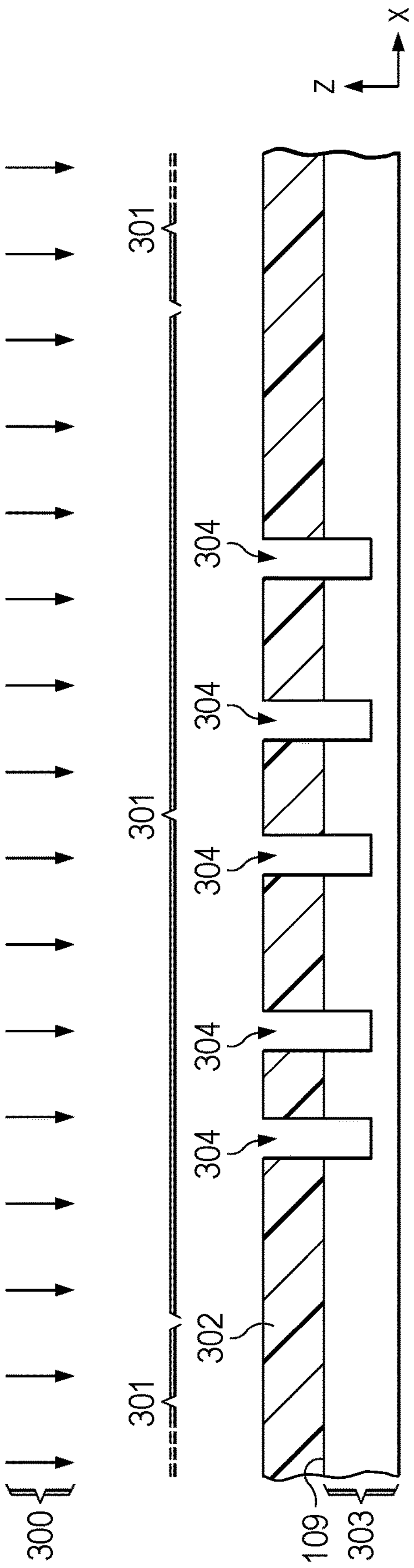
FIGS. 3-11 are partial side elevation views of the electronic device of FIG. 1 undergoing fabrication processing according to the method of FIG. 2.

The method 200 continues at 204 with backside trench formation in the prospective die areas of the wafer. FIG. 3 shows one example, in which a trench formation process 300 is performed across multiple prospective die areas 301 using a patterned etch mask 302 formed on the back or second side 109 of a starting wafer 303. Any suitable trench formation process 300 and associated equipment can be used, including without limitation etching, laser cutting, saw cutting, or combinations thereof, etc. In the illustrated example, the trench formation process 300 is a plasma etch process that forms trenches 304 that extend into the side 109 of the wafer 303 at designated locations of the respective die areas 301 (e.g., in a pattern corresponding to one or more identified or suspected hot spots 114 as illustrated in FIG. 1A above). The trenches 304 can be etched to a suitable depth into the side 109 of the wafer 303 (e.g., along the third direction Z in the orientation shown in FIG. 3). For example, the trenches 304 can be etched to a process depth based on the desired final depth for the finished electronic device 100 in consideration of any subsequent planarization steps.

Figure 4:
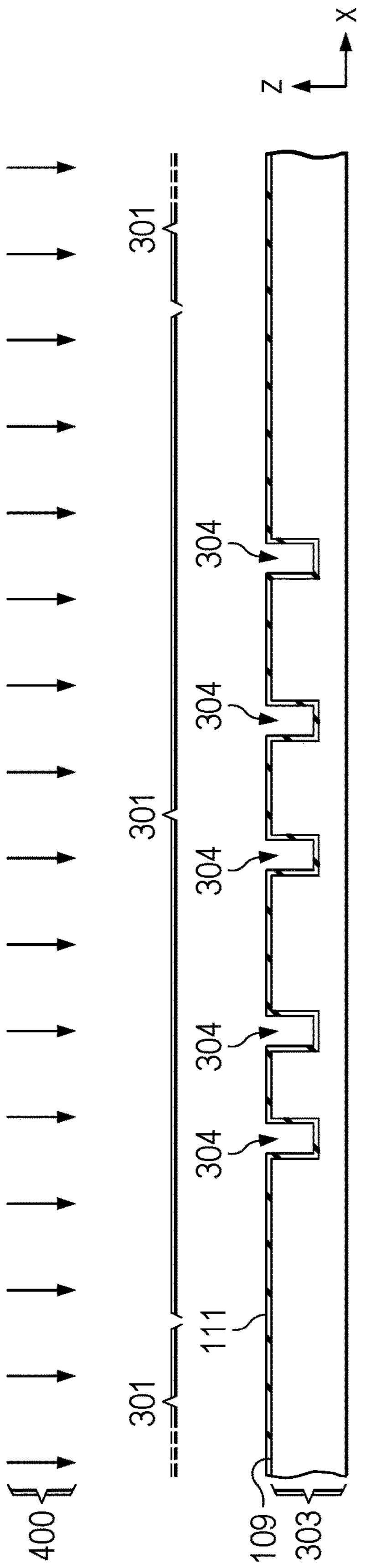

The method 200 in one example continues at 206 and FIG. 2 with forming an insulation layer (e.g., layer 111) on a bottom and sidewalls of the trench 304 before forming the thermally conductive material 110 in the trenches 304. FIG. 4 shows one example, in which a layer formation process 400 is performed that forms the insulation layer 111 on the exposed side 109 of the wafer 303 and also forms the insulation layer 111 on the bottoms and sidewalls of the respective trenches 304 in each prospective die area 301. In one example, the formation process 400 is a deposition process that forms the insulation layer 111. In another example, an oxidation process 400 can be used, for example, to form the insulation layer 111 as silicon dioxide by oxidizing the exposed portions of a silicon wafer 303. In another implementation, the insulation layer formation at 206 can be omitted.

Figure 5:
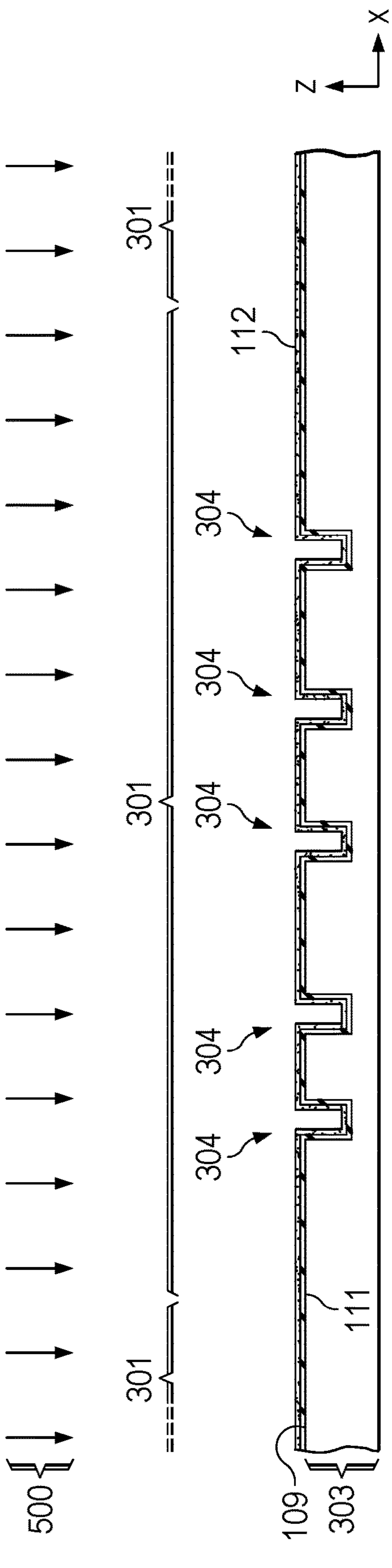

At 208 in FIG. 2, the method 200 in one example includes forming an adhesion layer (e.g., layer 112) on the trench bottoms and sidewalls. FIG. 5 shows one example, in which an adhesion in layer formation process 500 is performed that forms the adhesion layer 112. Any suitable adhesion layer formation process 500 can be used at 208, such as a deposition, etc. In one implementation, the adhesion layer 112 is formed on the previously formed insulation layer 111. In another implementation (e.g., where no insulation layer is used), the adhesion layer 112 is formed on the exposed side 109 of the wafer and along the semiconductor material of the bottoms and sidewalls of the trenches 304. In another implementation, the adhesion layer formation at 208 can be omitted.

Figure 6:
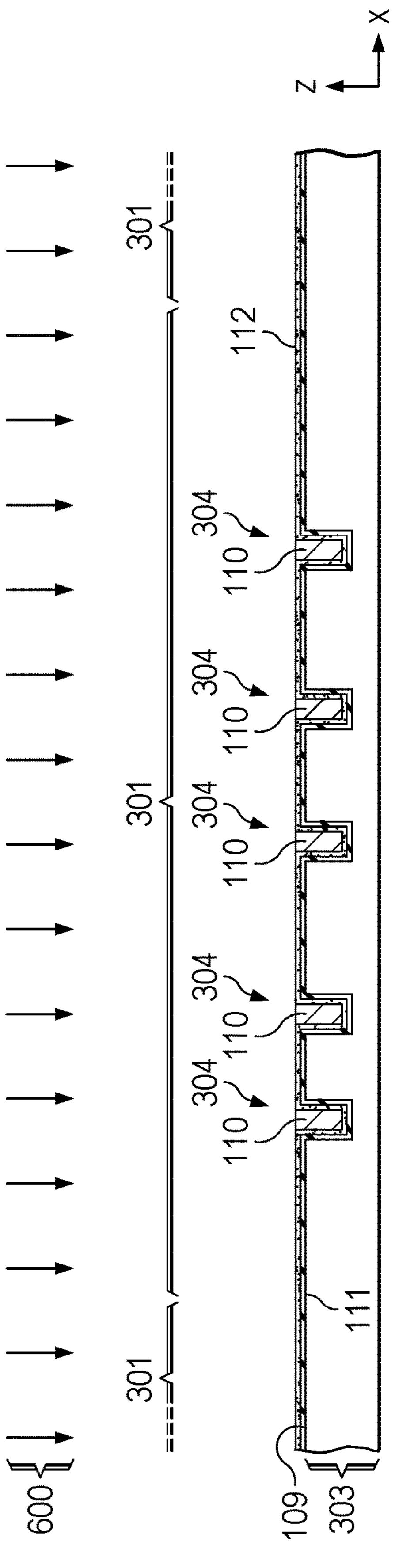

The method 200 continues at 210 in FIG. 2 with trench filling, for example, to fill the trenches 304 with metal or other suitable thermally conductive material 110. FIG. 6 shows one example, in which a trench fill process 600 is performed that forms the thermally conductive material 110 in the trenches 304. The process 600 in one example fills the trenches 304. In another implementation, the process 600 forms thermally conductive material 110 and portions of the trenches 304 without complete filling.

Any suitable process 600 can be used to form suitable thermally conductive material 110 in the trenches 304 having a thermal conductivity greater than that of the semiconductor material of the wafer 303. In one example, the thermally conductive material 110 is or includes metal. In this or another example, forming the thermally conductive material 110 includes performing an electroplating process 600, such as depositing a copper or other metal seed layer, followed by forming and patterning a plating mask (not shown) with suitable openings followed by electroplating the thermally conductive material 110 in the trenches 304 and possibly over a portion of the top side 109 of the wafer.

In another implementation, forming the thermally conductive material 110 at 210 in FIG. 2 includes performing a silk screening process. In other implementations, different types of processes 600 can be used, such as printing, dispensing, etc.

In a further implementation, the thermally conductive material 110 is or includes solder. One suitable example includes SAC305 or other suitable solder paste. In one implementation, the solder thermally conductive material 110 can be formed by a screen printing or silk screening process 600. In another implementation, the process 600 is a solder ball drop process using techniques and equipment similar to those used to form solder balls (e.g., solder ball terminals 104) in BGA type packaging processes.

In another implementation, the thermally conductive material 110 is or includes boron nitride. For example, a boron nitride paste can be formed in one example by a screen printing or silk screening process 600, ball drop processing 600, etc.

In a further implementation, the thermally conductive material 110 is or includes graphene. In one example, the formation process 600 is a deposition or other suitable process that forms graphene material 110 in the trenches 304 of the wafer 303.

Figure 7:
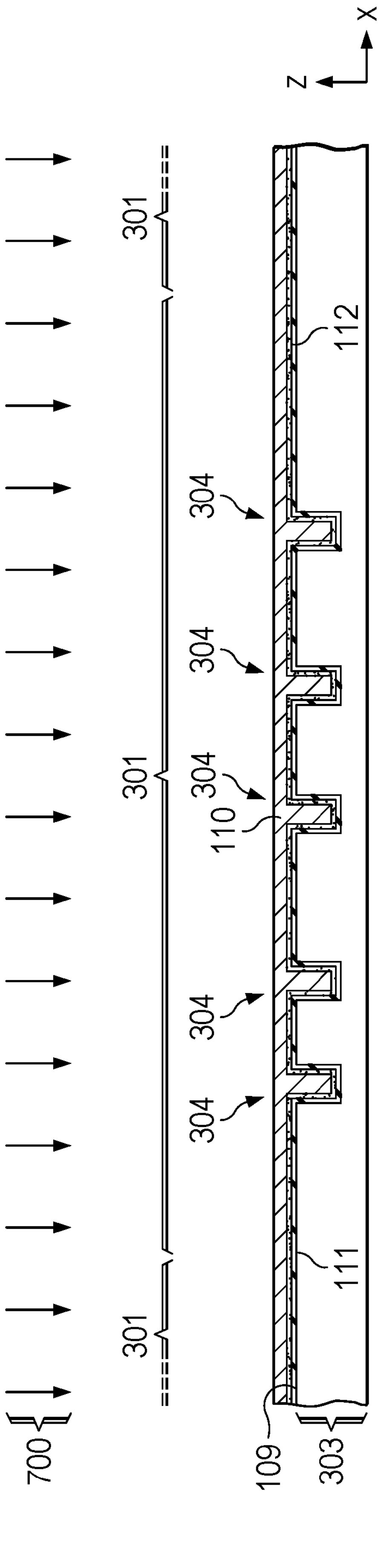

At 212 in FIG. 2, a top thermally conductive material can be formed using the selected thermally conductive material 110 (e.g., metal, graphene, solder, boron nitride, etc.) along at least a portion of the top side 109 of the wafer 303 (and possibly over any insulation layer 111 and/or adhesion layer 112). FIG. 7 shows one example, in which a process 700 is performed that forms further thermally conductive material 110 outside the trenches 304 and over the side 109 of the wafer 303. In one example, the process 700 is a continuation of the selected process 600 used that 210 to fill the trenches with the thermally conductive material 110. In another implementation, the process 700 is a different process that forms the further thermally conductive material 110 over the side 109 of the wafer 303. In another implementation, the top metal formation at 212 can be omitted.

Figure 8:
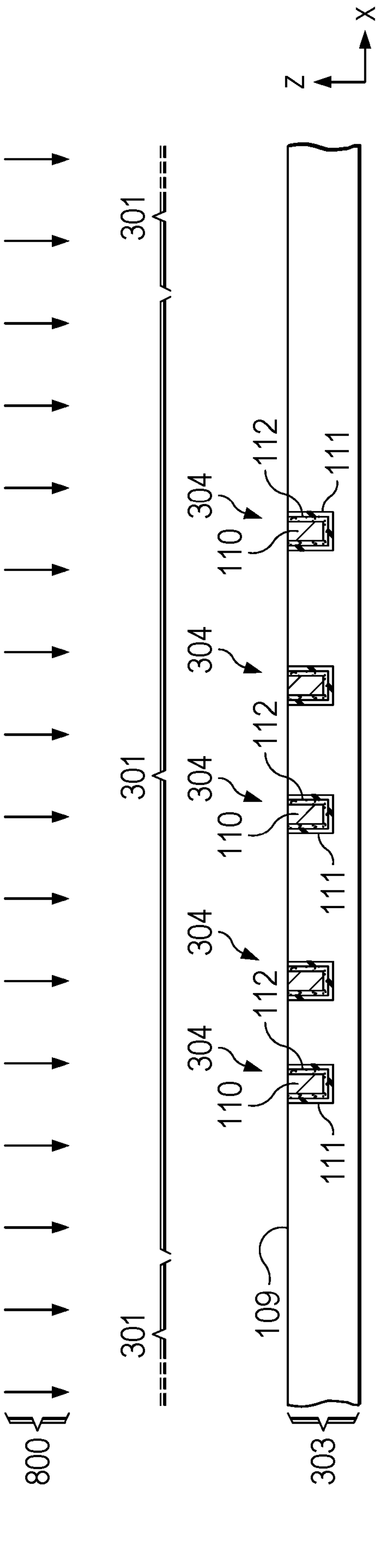

The method 200 continues at 214 with planarizing the back side 109 of the semiconductor wafer 303 after forming 210 the thermally conductive material 110 in the trenches 304. FIG. 8 shows one example, in which a planarization process 800 is performed that planarize is the side 109 of the wafer 303. Any suitable planarization process 800 can be used, such as mechanical and/or chemical mechanical polishing or back grinding, laser ablation, etc. The planarizing at 214 in one example can be used to remove any top metal extending on the top side 109 of the wafer 303 and/or to remove any previously formed insulation layer material 111 and/or adhesion layer material 112 along the side 109 of the wafer 303, leaving the thermally conductive material 110 (and any included layer 111 and/or 112) in the trenches 304 with a planarized top side 109 of the wafer 303 outside the trenches 304. In one example, the second or top side 109 of the wafer 303 undergoes a back grinding process 800 that advantageously planarizes the top side 109 of the semiconductor wafer 303 and removes any metallic residue remaining after the trench fill processing. The planarizing at 214 in one example sets the final wafer thickness and trench depth, for example, according to a design specification for a given electronic device design. As discussed further below in connection with FIGS. 12 and 13, the planarizing at 214 can be stopped prior to exposing the top side 109 of the semiconductor wafer 303, for example, where a particular design includes having thermally conductive material 110 extending along the top side 109 of the finished semiconductor die 108 (e.g., the electronic device 120 shown in FIG. 1B above).

Figure 9:
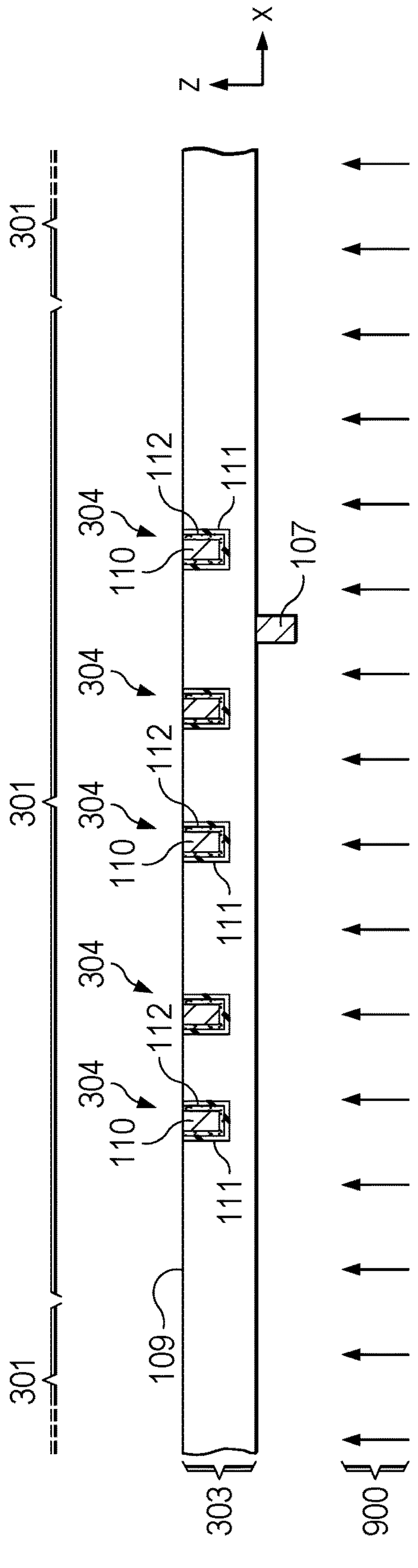

At 216 in FIG. 2, the method 200 continues with front side bumping operations to form the conductive metal terminals 107 at designated locations on the front (e.g., bottom) side of the wafer 303. FIG. 9 shows one example, in which a bumping process 900 is performed that forms one or more copper pillars or bumps or other conductive metal terminals 107 on the bottom side of the wafer 303. In another example, wafer back grind or other planarization of the second (back) side 129 can be performed after wafer bumping at 216 and prior to device separation and the planarization at 214 can be omitted. This approach can combine both the planarization of any remnant material from the trenches 103 with the wafer back grinding processing to reduce the thickness of the wafer to the desire value, thereby helping reduce production time and cost.

The method 200 continues at 218 in FIG. 2 die separation processing. FIG. 10 shows one example, in which a die singulation or separation process 1000 is performed that separates individual semiconductor dies 108 from the starting wafer 303. Any suitable die separation process 1000 can be used, for example, laser cutting, saw cutting, chemical etching, or combinations thereof. The example separation process 1000 in FIG. 10 cuts through the wafer 303 along lines 1002 as shown in FIG. 10 to separate the example semiconductor die 108 from the starting wafer 303.

The method 200 includes further packaging processing at 222 package the semiconductor die 108 in a package structure. FIG. 11 shows one example, in which packaging processing 1100 is performed that packages the semiconductor die 108 with the thermally conductive material 110 exposed outside the top side of the molded package structure 106. Any suitable packaging processing and materials can be used at 222, such as die attach processing to attach the semiconductor die 108 to a starting lead frame (not shown) or a panel array of unit areas of a multilevel package substrate 102. Suitable examples can include flip chip soldering to form electrical connections and possibly wire bonding to form bond wire electrical interconnections, attachment of other electronic components to a lead frame or substrate, as well as molding operations to form a molded package structure 106 that exposes the top side 109 of the semiconductor die 108 and the thermally conductive material 110 in the trenches 113, and final device separation and testing to separate individual packaged electronic devices 100 from a processed panel array with rows and columns of unit areas (not shown).

Referring also to FIGS. 12 and 13, in an alternate implementation of the method 200 includes providing a thermally conductive material 110 extending along the top side 109 of the semiconductor die 108. FIGS. 12 and 13 illustrate the electronic device 120 of FIG. 1B above undergoing processing at 214 and 216 according to one example. In this implementation, the wafer backside planarization at 214 in FIG. 2 is discontinued before exposure of the top side 109 of the processed wafer 303. FIG. 12 shows one example, in which a planarization process 1200 is performed (e.g., the same planarizing process 800 described in connection with FIG. 8 above) that planarize is the thermally conductive material 110 previously formed in the trenches 304 and above the top side 109 of the wafer 303. The process 1200 in this example provides a planar top surface of the thermally conductive material 110 above the top side 109 of the wafer 303. FIG. 13 shows further processing in this example with wafer front side bumping processing at 216 by a bumping process 1300 (e.g., the same bumping process 900 as illustrated and described above in connection with FIG. 9.

Described examples can improve electronic device thermal performance in a variety of different device designs, such as an exposed die FCCSP package by forming deep silicon trenches or other suitable trenches 304, 113 in the backside of the semiconductor material during wafer processing, and fully or partially filling the trenches with thermally conducting material to improve the bulk thermal conductivity, and specific examples can provide localized trench formation in filling for enhanced thermal performance proximate to known or suspected hotspots of a given device design. The described solutions provide a cost effective low complexity alternative to lidded solutions and can help reduce fabrication costs and increase throughput in the assembly process. In addition, the described solutions do not involve package size increases and can be advantageously employed in designs targeting high device and power density system applications. In specific implementations, existing wafer plasma dicing equipment and techniques as well as existing solder ball drop technology can be repurposed in forming and filling the trenches 113, 304 to take advantage of existing manufacturing techniques and tools while providing enhanced thermal performance without increasing cost. In various implementations, thermal improvement can be achieved for thermal performance parity or less than 20% theta $j_c$ difference to a lidded solution. Moreover, the described solutions mitigate or avoid long throughput times associated with lidded solutions in assembly (e.g., dispensing thermally conductive interface adhesive material (TIM), lid placement, lid cure, and cost of a copper or other metal lid.

Modifications are possible in the described examples, and other implementations are possible, within the scope of the claims.

What is claimed is:

1. An electronic device, comprising:

a semiconductor die having a semiconductor material with a first thermal conductivity, opposite first and second sides, a terminal on the first side, a trench extending into the second side, and a thermally conductive material in the trench, the thermally conductive material having a second thermal conductivity that is greater than the first thermal conductivity, the first side of the semiconductor die facing a lead frame or substrate; and a package structure that encloses a portion of the semiconductor die and a portion of the lead frame or substrate, and the package structure exposes a portion of the thermally conductive material along the second side of the semiconductor die.

2. The electronic device of claim 1, wherein the thermally conductive material extends outside the trench and covers a portion of the second side of the semiconductor die.

3. The electronic device of claim 1, wherein the thermally conductive material includes graphene.

4. The electronic device of claim 1, wherein the lead frame or substrate is a substrate, and the terminal is soldered to the substrate.

5. The electronic device of claim 1, wherein the thermally conductive material includes metal.

6. The electronic device of claim 1, wherein the thermally conductive material includes solder.

7. The electronic device of claim 1, wherein the thermally conductive material includes boron nitride.

8. The electronic device of claim 1, further comprising an insulation layer between the thermally conductive material and a sidewall of the trench.

9. The electronic device of claim 1, wherein the semiconductor die has multiple trenches that extend into the second side at designated locations in a pattern corresponding to one or more identified or suspected hotspots.

10. The electronic device of claim 1, wherein the semiconductor die has multiple trenches that extend into the second side and form a pattern along the entire second side.

11. A system, comprising:

a circuit board; and an electronic device, comprising a semiconductor die, a lead frame or substrate soldered to the circuit board, and a package structure;

the semiconductor die having a semiconductor material with a first thermal conductivity, opposite first and second sides, a terminal on the first side, a trench extending into the second side, and a thermally conductive material in the trench, the thermally conductive material having a second thermal conductivity that is greater than the first thermal conductivity, the first side of the semiconductor die facing the lead frame or substrate; and the package structure enclosing a portion of the semiconductor die and a portion of the lead frame or substrate, and the package structure exposing a portion of the thermally conductive material along the second side of the semiconductor die.

12. The system of claim 11, further comprising a heat sink attached to a portion of the second side of the semiconductor die and contacting the thermally conductive material.

* * * * *